(12) United States Patent
Yashima

(10) Patent No.: US 8,183,545 B2
(45) Date of Patent: May 22, 2012

(54) CHARGED PARTICLE BEAM WRITING APPARATUS, CHARGED PARTICLE BEAM WRITING METHOD AND APPARATUS OF PROCESSING DATA FOR CHARGED PARTICLE BEAM WRITING

(75) Inventor: Jun Yashima, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 92 days.

(21) Appl. No.: 12/850,928

(22) Filed: Aug. 5, 2010

(65) Prior Publication Data

US 2011/0046762 A1   Feb. 24, 2011

(30) Foreign Application Priority Data

Aug. 19, 2009   (JP) .................................. 2009-189986

(51) Int. Cl.
*H01J 3/14* (2006.01)
*H01J 5/10* (2006.01)
*G21K 1/08* (2006.01)
*G03F 9/00* (2006.01)

(52) U.S. Cl. ............. 250/492.22; 250/492.2; 250/492.1; 250/492.3; 250/306; 250/307; 250/396 R; 250/398

(58) Field of Classification Search ............. 250/492.22, 250/492.2, 492.1, 492.3, 306, 307, 396 R, 250/398
See application file for complete search history.

(56) References Cited

U.S. PATENT DOCUMENTS 7,601,968 B2 * 10/2009 Abe et al. .................. 250/396 R
7,608,845 B2 * 10/2009 Abe et al. ................. 250/492.22
7,926,007 B2 * 4/2011 Shibata ........................... 716/55
8,065,635 B2 * 11/2011 Yashima et al. ................ 716/50
8,076,656 B2 * 12/2011 Shibata .................... 250/492.22

FOREIGN PATENT DOCUMENTS

JP   2008-218857   9/2008

OTHER PUBLICATIONS

U.S. Appl. No. 13/235,432, Sep. 18, 2011, Nakayamada, et al.

* cited by examiner

*Primary Examiner* — Nikita Wells
(74) *Attorney, Agent, or Firm* — Oblon, Spivak, McClelland, Maier & Neustadt, L.L.P.

(57) ABSTRACT

There is provided a charged particle beam writing apparatus in which data processing is optimized by automatically dividing process regions on which parallel distributed processing is performed. A charged particle beam writing apparatus includes: a data storage unit to which layout data defining a plurality of figure patterns in a chip region is input and which stores the layout data; a dividing unit configured to divide the chip region into a plurality of process regions; a shot data generating unit configured to perform distributed processing on pattern data in the process regions using a plurality of computing processors so as to convert the pattern data to shot data for shooting a charged particle beam onto a target object; a determining and instructing unit configured to compare an amount of output data from each of the computing processors with a predetermined threshold, and when the amount of the output data is larger than the threshold, instruct corresponding one of the computing processors to divide corresponding one of the process regions and continue the data processing; and a writing unit configured to write on the target object using the shot data.

12 Claims, 8 Drawing Sheets

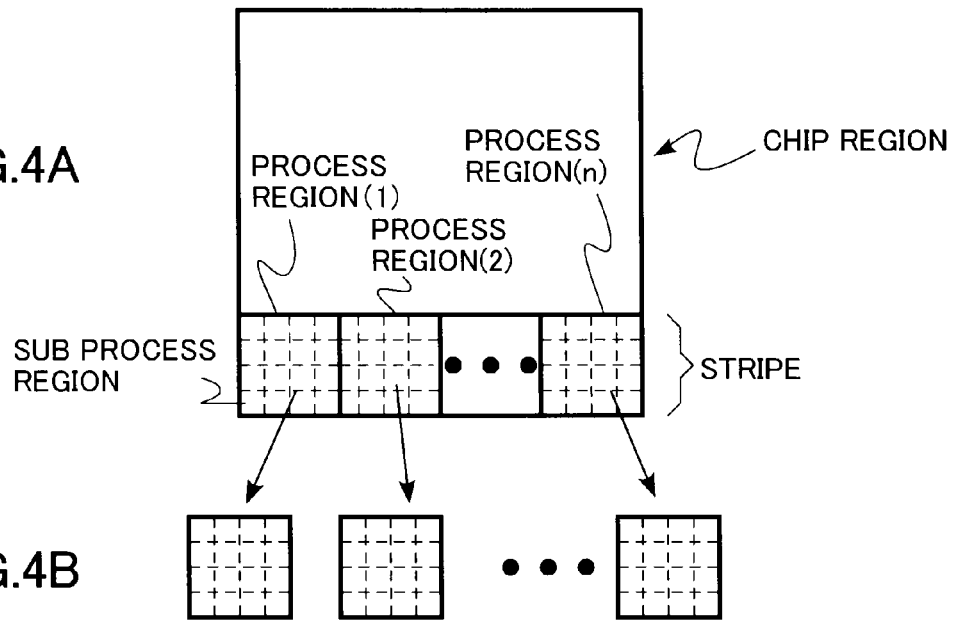
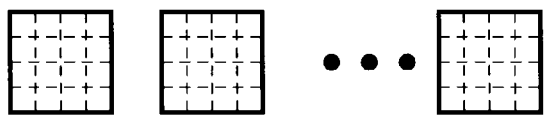
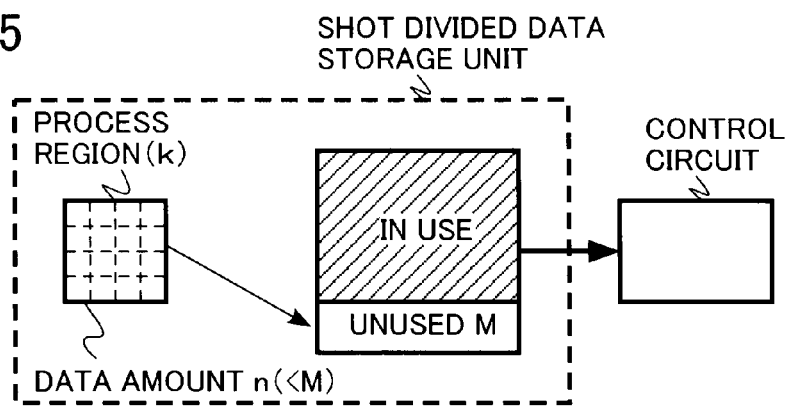

CHARGED PARTICLE BEAM WRITING APPARATUS, CHARGED PARTICLE BEAM WRITING METHOD AND APPARATUS OF PROCESSING DATA FOR CHARGED PARTICLE BEAM WRITING

CROSS-REFERENCE TO RELATED APPLICATION

This application is based upon and claims the benefit of priority from Japanese Patent Applications No. 2009-189986, filed on Aug. 19, 2009, the entire contents of which are incorporated herein by reference.

FIELD OF THE INVENTION

The present invention relates to a charged particle beam writing apparatus and an charged particle beam writing method and an apparatus of processing data for charged particle beam writing, which form a figure pattern on a target object.

BACKGROUND OF THE INVENTION

A lithography technique is used for forming a desired circuit pattern on a semiconductor device. In the lithography technique, a pattern is transferred using an original pattern referred to as a mask (reticle). In order to manufacture a precise reticle, an electron beam writing technique having an excellent resolution is used.

As one type of an electron beam writing apparatus for electron beam writing on a reticle, there is a variable-shaped writing apparatus. In the variable-shaped writing apparatus, a figure pattern is formed on a target object placed on a movable stage by an electron beam which is shaped by passing through an opening of a first shaping aperture plate and an opening of a second shaping aperture plate.

Such an electron beam writing apparatus requires data processing for converting layout data input thereto to shot data for actually shooting an electron beam onto a target object. The data processing is required to be optimized corresponding to increasingly complex layout data and writing method.

JP-A 2008-218857 discloses a method for allocating CPU according to the number of patterns in a process region upon parallel distributed processing of data.

SUMMARY OF THE INVENTION

A charged particle beam writing apparatus according to an aspect of the invention includes: a data storage unit to which layout data defining a plurality of figure patterns in a chip region is input and which stores the layout data; a dividing unit configured to divide the chip region into a plurality of process regions; a shot data generating unit configured to perform distributed processing on pattern data in the process regions using a plurality of computing processors so as to convert the pattern data to shot data for shooting a charged particle beam onto a target object; a determining and instructing unit configured to compare an amount of output data from each of the computing processors with a predetermined threshold, and when the amount of the output data is larger than the threshold, instruct corresponding one of the computing processors to divide corresponding one of the process regions and continue the data processing; and a writing unit configured to write on the target object using the shot data.

A charged particle beam writing method according to an aspect of the invention includes: being input layout data defining a plurality of figure patterns in a chip region and storing the layout data; dividing the chip region into a plurality of process regions; performing distributed processing on pattern data in the process regions using a plurality of computing processors so as to convert the pattern data to shot data for shooting a charged particle beam onto a target object; comparing an amount of output data from each of the computing processors with a predetermined threshold, and when the amount of the output data is larger than the threshold, instructing corresponding one of the computing processors to divide corresponding one of the process regions and continue the data processing; and writing on the target object using the shot data.

An apparatus of processing data for charged particle beam writing according to an aspect of the invention includes: a data storage unit to which layout data defining a plurality of figure patterns in a chip region is input and which stores the layout data; a dividing unit configured to divide the chip region into a plurality of process regions; a shot data generating unit configured to perform distributed processing on pattern data in the process regions using a plurality of computing processors so as to convert the pattern data to shot data for shooting a charged particle beam onto a target object; a determining and instructing unit configured to compare an amount of output data from each of the computing processors with a predetermined threshold, and when the amount of the output data is larger than the threshold, instruct corresponding one of the computing processors to divide corresponding one of the process regions and continue the data processing.

BRIEF DESCRIPTION OF THE DRAWINGS

FIG. 4 is an explanatory diagram of dividing data according to Embodiment 1.

FIG. 5 is an explanatory diagram of an effect of Embodiment 1.

DETAILED DESCRIPTION OF THE EMBODIMENTS

Hereinafter, embodiments of the invention will be explained referring to the accompanying drawings. Hereinafter in the embodiments, a configuration, in which an electron beam is used as an example of a charged particle beam, is explained. However, the charged particle beam is not limited to the electron beam but may be a beam using charged particles such as an ion beam.

(Embodiment 1)

A charged particle beam writing apparatus according to Embodiment 1 includes a data storage unit to which layout data defining a plurality of figure patterns on a chip region is input and which stores the layout data. The charged particle beam writing apparatus also includes: a dividing unit configured to divide the chip region into a plurality of process regions; a shot data generating unit configured to perform distributed processing on pattern data in the process regions using a plurality of calculating processors so as to convert the pattern data to shot data for shooting a charged particle beam onto a target object; a determining and instructing unit configured to compare an amount of output data from each of the calculating processors with a predetermined threshold, and when the amount of the output data is larger than the threshold, to instruct the computing processor to divide corresponding one of the process regions and continue the processing; and a writing unit configured to write on the target object using the shot data.

In the charged particle beam writing apparatus according to the embodiment configured as described above, when the dividing unit generates a process region having larger amount of data than expected, the process region is automatically divided during data processing. Therefore, a decrease in processing speed, unexpected stop of writing, and the like can be prevented.

Figure 1:
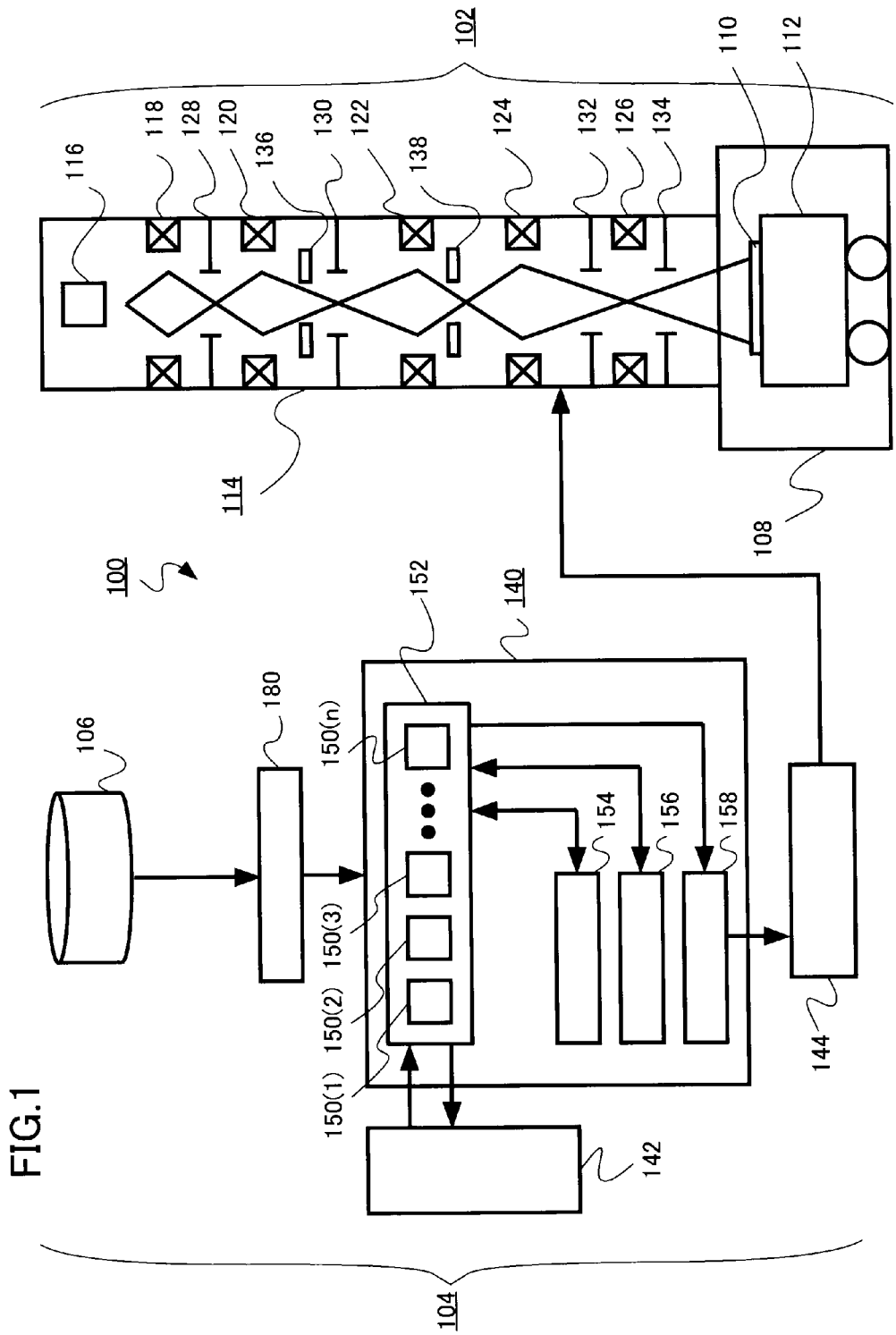
FIG. 1 is a schematic configuration diagram of an electron beam writing apparatus according to Embodiment 1.

FIG. 1 is a schematic configuration diagram of the electron beam writing apparatus according to the embodiment.

The electron beam writing apparatus 100 is an example of the charged particle beam writing apparatus. The electron beam writing apparatus 100 includes a writing unit 102 and a control unit 104 configured to control writing operation of the writing unit 102. The electron beam writing apparatus 100 forms a predetermined pattern on a target object 110.

In a target object chamber 108 of the writing unit 102, a stage 112 on which the target object 110 is placed is housed. The stage 112 is driven in X direction (right-left direction on the paper), Y direction (front-rear direction of the paper), and Z direction by the control unit 104. The target object 110 may be a mask for exposure when a pattern is transferred on a wafer on which a semiconductor device is formed, for example. The mask may be a mask blank on which any pattern is not formed, for example.

On the upper side of the target object chamber 108, an electron beam optical system 114 is provided. The electron beam optical system 114 includes: an electron gun assembly 116; various lenses 118, 120, 122, 124, and 126; a deflector for blanking 128; a deflector for changing beam size 130; a main deflector for beam scanning 132; a sub deflector for beam scanning 134; and a first aperture plate 136 and second aperture plate 138 for beam shaping to form by a variable-shaped beam, and the like.

The control unit 104 includes: a data storage unit 106; a dividing unit 180; a shot data generating unit 140; a determining and instructing unit 142; and a control circuit 144.

Layout data defining a plurality of figure patterns in a chip region is input to the data storage unit 106 and the data storage unit 106 stores the layout data. The layout data is base data of a pattern to be formed. The layout data may be a circuit pattern of a semiconductor integrated circuit, for example. As the data storage unit 106, any storage medium such as a magnetic disk may be used.

The dividing unit 180 has a function to divide the chip region into a plurality of process regions. For example, the chip region is automatically divided into a plurality of process regions having the same region, which is predetermined.

The shot data generating unit 140 includes: a computing process unit 152 that includes a plurality of computing processors 150(1) to 150(n); a density calculation result storage unit 154; a correction amount calculation result storage unit 156; and a shot division result storage unit 158. The computing processor 150(1) to 150(n) may be CPUs, for example. The density calculation result storage unit 154, the correction amount calculation result storage unit 156, the shot division result storage unit 158 may be any storage medium such as a semiconductor memory.

The shot data generating unit 140 has a function to perform parallel distributed processing on pattern data of figure patterns in the process regions using the plurality of computing processors so as to convert the pattern data to shot data that is data of internal control format unique to the electron beam writing apparatus 100.

The determining and instructing unit 142 monitors an amount of output data from each of the computing processors 150(1) to 150(n), compares the monitored amount of output data with a predetermined threshold, and when the amount of the output data is larger than the threshold, instructs corresponding one of the computing processors 150 (1) to 150(n) to divide corresponding one of the process regions and continue the data processing.

The control circuit 144 has a function to control the writing unit 102 based on the shot data generated by the shot data generating unit 140.

In FIG. 1, components other than those necessary for explaining the embodiment are not shown. It should be appreciated that any other components that are typically necessary in the electron beam writing apparatus 100 may be included.

Figure 2:
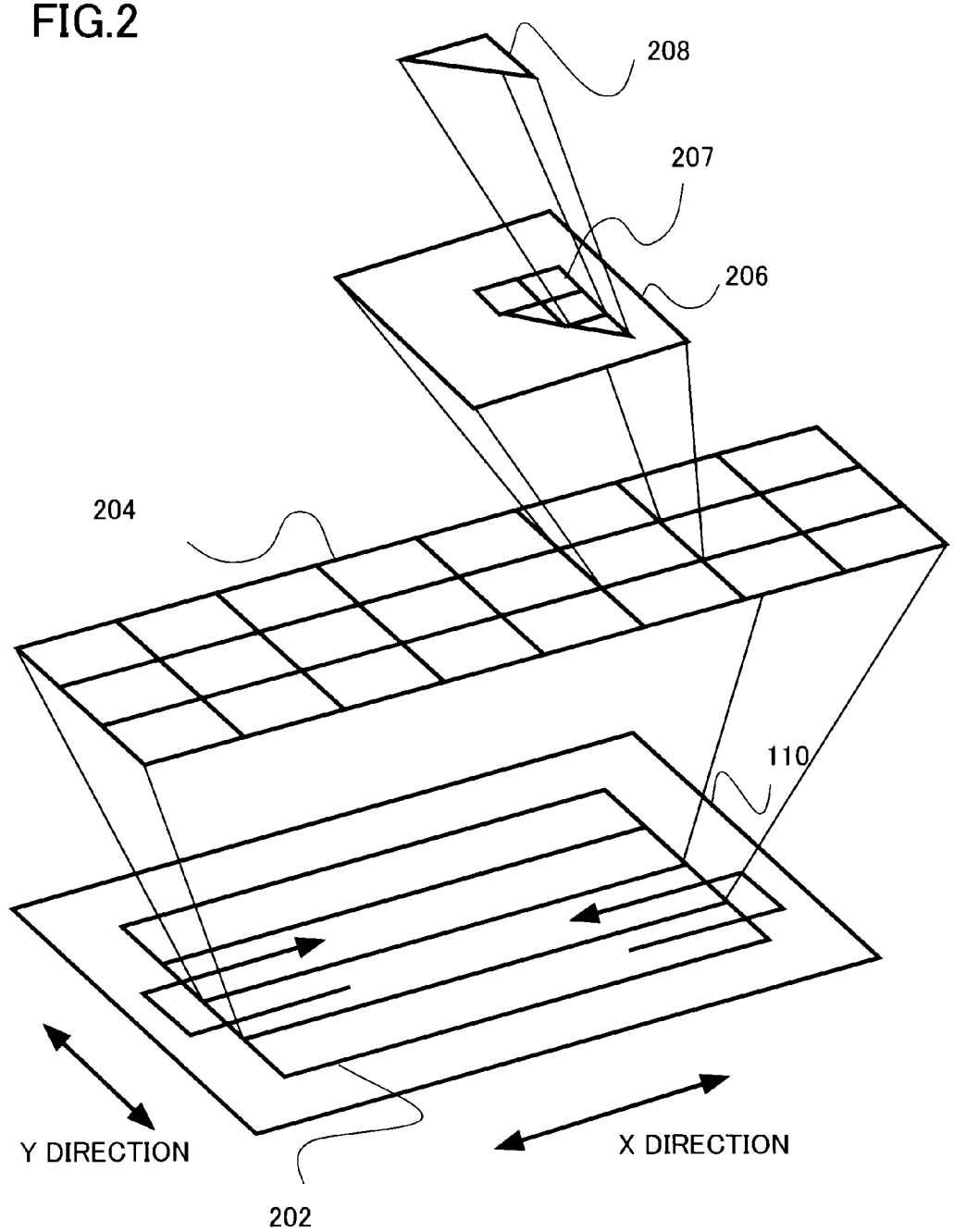
FIG. 2 is an explanatory diagram of a writing method used in Embodiment 1.
Figure 3:
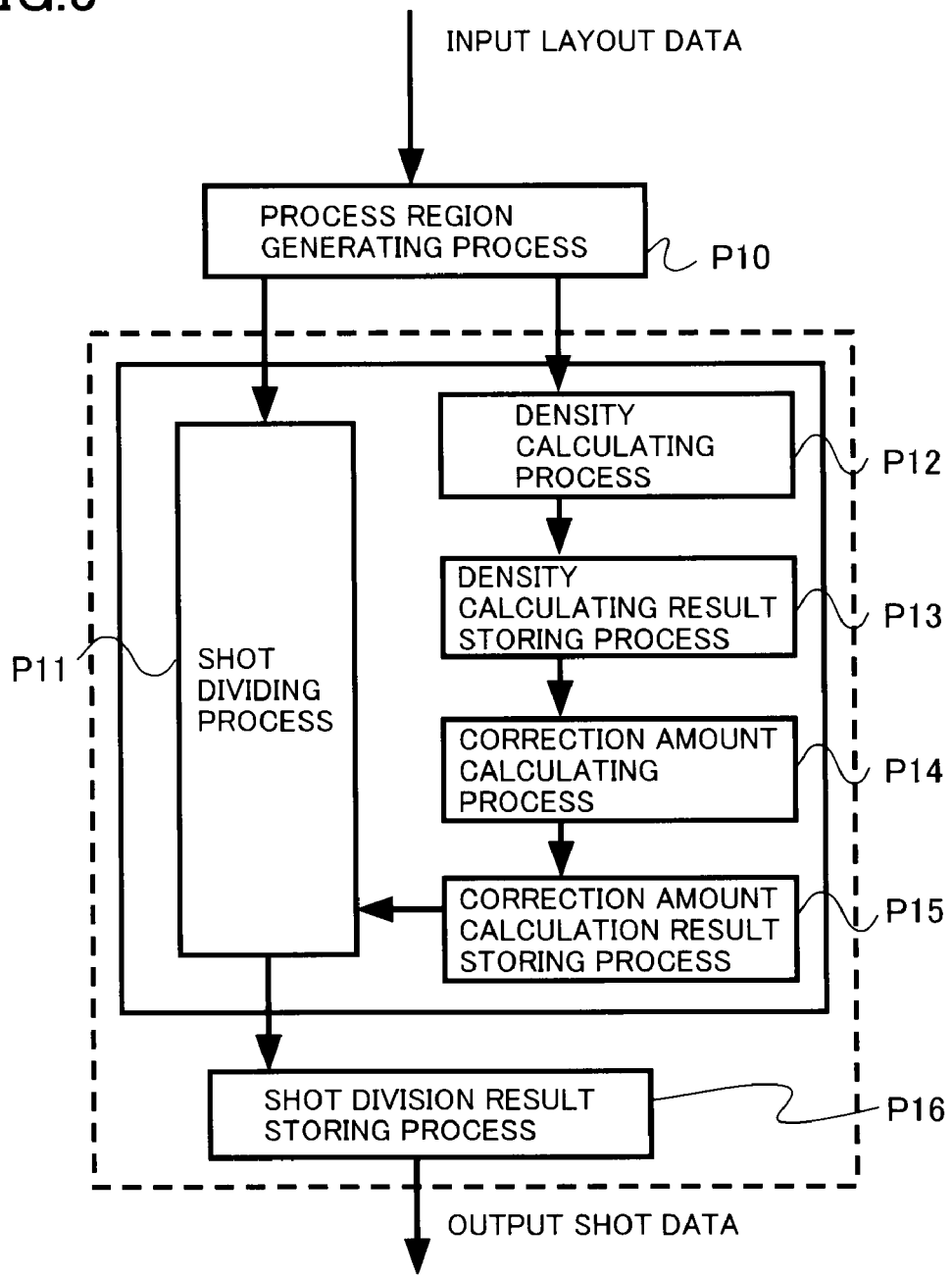
FIG. 3 is an explanatory diagram of a processing performed by a control unit of the electron beam writing apparatus according to Embodiment 1.

Next, a writing method using the electron beam writing apparatus 100 is explained referring to FIGS. 1 to 3. FIG. 2 is an explanatory diagram of a writing method of vector scanning type and stage continuously moving type used in the embodiment. FIG. 3 is an explanatory diagram of a processing performed by a control unit of the electron beam writing apparatus according to the embodiment.

Before explaining a processing performed by the control unit 104, an operation of the writing unit 102 will be explained referring to FIGS. 1 and 2 for convenience. The writing unit 102 writes on the target object 110 using the shot data generated by the control unit 104.

In actual writing, a shape of an electron beam emitted from the electron gun assembly 116 is variably controlled by the deflector for changing beam size 130, and the first aperture plate 136 and second aperture plate 138 for beam shaping and writing process is performed by the vector scanning type (two-dimensional scanning method) and the stage continuously moving type methods.

First, a pattern 202 to be formed on the target object 110 is divided into thin rectangular frames (or stripes) 204 and the frames 204 are further divided into regions called sub fields 206. Only necessary parts of the regions are formed by deflecting a variable-shaped beam 208 shaped by the first aperture plate 136 and the second aperture plate 138 of FIG. 1.

At this time, the writing process is performed while continuously moving the stage 112 (FIG. 1). At this time, scanning on a part on which the writing is not necessary with the beam turned off is not performed as one-dimensional scanning method, so that the write speed is increased and the throughput is improved. At this time, a two-staged deflector including the main deflector 132 and the sub deflector 134 (FIG. 1) is used. The sub field 206 is positioned by the main deflector 132 (FIG. 1) according to main deflecting position data transferred from the control unit 104 and the sub field 206 is formed by the sub deflector 134 according to sub deflecting position data, shot size data, and the like also transferred from the same control unit 104.

When forming of one sub field 206 is finished, forming of next sub field 206 is started. Further, when forming of one frame 204 that is a group of a plurality of sub fields 206 is finished, the stage 112 that have been continuously moving in X direction (FIG. 1) stepwisely moves in Y direction and the process described above is repeated so as to form frame regions sequentially. Here, the frames 204 are thin rectangular writing regions defined by a deflecting width of the main deflector 132 (FIG. 1) and the sub fields 206 are units of writing region defined by a deflecting width of the sub deflector 134 (FIG. 1).

The control unit 104 generates shot data for the writing performed by the writing unit 102 from layout data.

Layout data defining a plurality of figure patterns in a chip region is input to the data storage unit 106 and the layout data is stored.

The dividing unit 180 divides the chip region in the layout data supplied from the data storage unit 106 into a plurality of process regions.

Then, the shot data generating unit 140 converts the pattern data of the plurality of figure patterns defined by the layout data so as to generate shot data for shooting an electron beam onto the target object. Upon the conversion, parallel distributed processing is performed to improve data processing speed. The shot data is a group of data units of figure patterns (shot patterns) corresponding to a shape of the write variable-shaped beam (triangular, rectangular, or the like). The shot pattern is a shot unit used when an electron beam is shot onto a target object.

FIG. 3 is an explanatory diagram of a processing process performed by the dividing unit 180 and the shot data generating unit 140. FIG. 4 is an explanatory diagram of dividing data according to the embodiment. The processing processes includes a process region generating process P10, a shot dividing process P11, a density calculating process P12, a density calculation result storing process P13, a correction amount calculating process P14, a correction amount calculation result storing process P15, and a shot division result storing process P16.

In the process region generating process P10, the chip region is divided into a plurality of stripes as shown in FIG. 4A so that the layout data can be processed through parallel distributed processing in a later processing process. Further, each of the stripes is divided into a plurality of process regions (1) to (n), which are process units of parallel distributed processing. One process region is further divided into a plurality of sub process regions (sub fields). The process region generating process P10 is performed by the dividing unit 180.

A size of the process region is determined in such a manner that amount of data of the process region is amount of data allowing a later processing process to be efficiently performed, for example. For example, dividing is automatically performed in such a manner that each of the process regions having the same area (same size), as shown in FIG. 4A.

The process regions (1) to (n) generated in the process region generating process P10 is converted to shot divide data including data of units of shot of variable-shaped beam by the electron beam writing apparatus 100 in the shot dividing process P11.

In order to form a pattern on the target object more precisely, it is desirable that a correction amount such as proximity effect correction/fogging error correction is added to shot divide data obtained by dividing in the shot dividing process P11. The correction amount is calculated in the density calculating process P12 and the correction amount calculating process P14.

For each of the process regions generated in the process region generating process P10, actual density of pattern data in the process region, which is actual density of a figure pattern in the region, is calculated in the density calculating process P12. The calculated density of the pattern data is stored in a storage medium as pattern density data in the density calculation result storing process P13. Specifically, the density is stored in the density calculation result storage unit 154 of FIG. 1.

In the correction amount calculating process P14, the correction amount such as proximity effect correction/fogging error correction is calculated using the pattern density data. The calculated correction amount is stored in a storage medium as correction amount data in the correction amount calculation result storing process P15. Specifically, the correction amount is stored in the correction amount calculation result storage unit 156 of FIG. 1.

The correction amount stored in the correction amount calculation result storage unit 156 is added to the shot divide data for the corresponding process region and the obtained shot divide data is stored in a storage medium in the shot division result storing process. Specifically, the shot divide data is stored in the shot division result storage unit 158 of FIG. 1.

The shot dividing process P11, the density calculating process P12, and the correction amount calculating process P14 are performed by using the plurality computing processor 150(1) to 150(n) of FIG. 1. Each process for each of the process regions (1) to (n) (FIGS. 4A and 4B) is distributed to the plurality of computing processor 150(1) to 150(n) and processed through parallel distributed processing.

The data stored in the shot division result storage unit 158 is sequentially transferred to the control circuit 144 as shot data. Based on the shot data, the writing unit 102 writes on the target object 110.

The determining and instructing unit 142 monitors an amount of output data from each of the computing processors 150(1) to 150(n) of the computing process unit 152, compares the monitored amount of output data with a predetermined threshold, and when the amount of the output data is larger than the threshold, instructs the corresponding computing processor to divide the corresponding process region and continue the data processing. The threshold may be set to an appropriate value considering a capacity of the storage medium in which data of the amount of output data from the computing processor 150(1) to 150(n) is stored, the processing speed of each of the processes, and the like, for example.

FIGS. 5 and 6 are explanatory diagrams of an effect of the embodiment. Here, a process where the shot divide data generated in the shot dividing process P11, which is the most downstream process among the processes performed by the shot data generating unit 140, is transferred to the shot division result storage unit 158 is explained as an example.

As shown in FIG. 5, the shot dividing process P11 is performed for a process region (k) using a specific computing processor, and the generated output data (amount of data N) is transferred to the shot divided data storage unit and stored in unused region (amount of data M) thereof. Data stored in the shot divided data storage unit is sequentially transferred to the control circuit according to a writing order to be used for writing process.

Assuming that the amount of data M is smaller than the amount of data N, the output data is not transferred to the shot divided data storage unit until there is enough unused region.

Also assuming that the process region (k) is the process region to be written next, the writing process unfortunately stops since there is not enough unused region in the shot divided data storage unit.

Figure 6A:
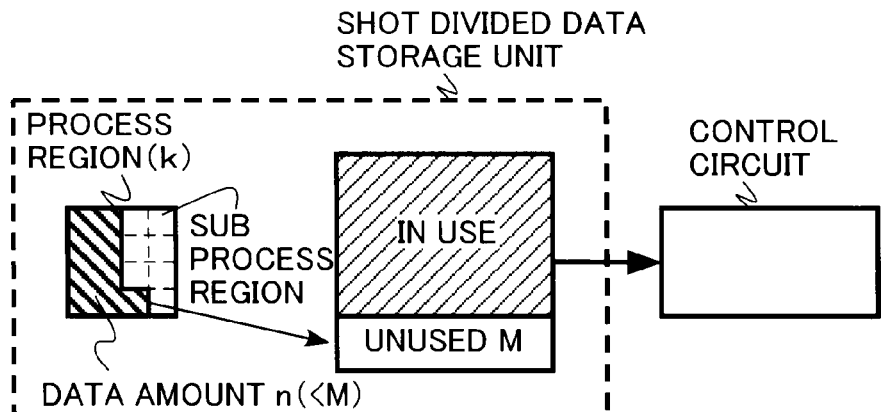
FIG. 6 is an explanatory diagram of an effect of Embodiment 1.

In the embodiment, even when the amount of data M is smaller than the amount of data N, the process region is automatically divided, and thus the output data can be transferred to the shot divided data storage unit. Specifically, a predetermined threshold is defined for the amount of output data. When the amount of output data from the computing processor that is performing the shot dividing process P11 exceeds the threshold as shown in FIG. 6A, the process region is divided into smaller regions and only data in a region on which the process is already performed (shaded area in the process region (k) in FIG. 6A) is transferred to the shot divided data storage unit. The threshold may be set to an appropriate value considering a capacity of the shot divided data storage unit, the processing speed, data transfer rate to the control circuit, and the like.

Figure 6B:
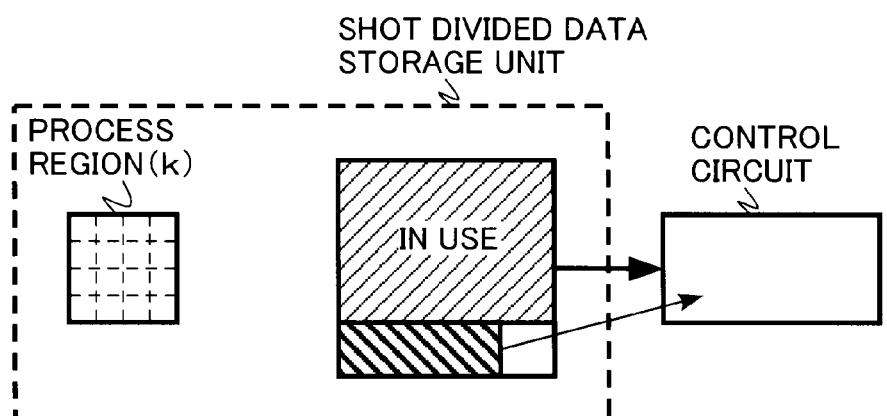
Figure 6C:
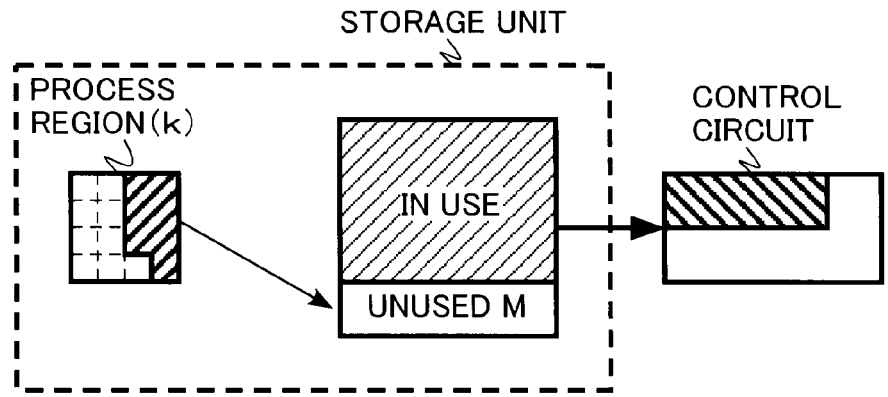

With such a configuration, even if the process region (k) is the process region to be written next, the writing process can be continued by dividing the process region into smaller regions and transferring only output data on which the process is already performed to the control circuit as shown in FIGS. 6B and 6C. The shot dividing process P11 on the remaining region (shaded area of the process region (k) in FIG. 6C) in the process region (k) is continued as is.

As described above, in the charged particle beam writing apparatus according to the embodiment, if there is a part locally having a large amount data in the chip region so that the dividing unit generates a process region having larger amount of data than expected, for example, the process region is automatically divided into smaller regions during data processing. Therefore, a decrease in processing speed, unexpected stop of writing, and the like due to excess amount of data can be prevented.

Also in the embodiment, it is desirable that each of the process regions is previously sub-divided into sub process regions (sub fields) of a certain size as shown in FIGS. 4A and 4B, and the determining and instructing unit instructs to continue the process by dividing the process region to units of the sub process region as shown in FIG. 6A.

The reason is that the data processing can be simplified by fixing the division unit rather than setting continuously. For example, the correction amount stored in the correction amount calculation result storage unit 156 is added to the shot divide data for the corresponding process region and the obtained shot divide data is stored in a storage medium in the shot division result storing process as described above. In this case, the shot divide data can be easily matched with the correction amount if the division unit of the process region is fixed. For example, if the division unit is set to a sub field unit that is a unit of writing region defined by a deflecting width of the sub deflector 134 (FIG. 1), the data processing by the control circuit and the writing unit can be simplified.

(Embodiment 2)

A charged particle beam writing apparatus according to Embodiment 2 is similar to that according to Embodiment 1 excepting that the charged particle beam writing apparatus further includes a predicting unit configured to predict a shot density when the plurality of figure patterns are converted to shot patterns of shot units used when a charged particle beam is shot onto the target object, and the dividing unit divides the chip region into a plurality of process regions based on the predicted shot density. Therefore, the description of contents duplicating those of the Embodiment 1 will not be repeated.

In addition to the effect of Embodiment 1, in the charged particle beam writing apparatus according to the embodiment, the dividing unit can precisely determine a size of the process region not to exceed the amount of data allowed in later processes in processing since the apparatus includes the predicting unit. At this time, a data processing load can be reduced so as to improve data processing speed of the predicting unit by not requiring an excess predicting precision for the predicting unit. Consequently, data processing of still better efficiency than Embodiment 1 is possible.

Figure 7:
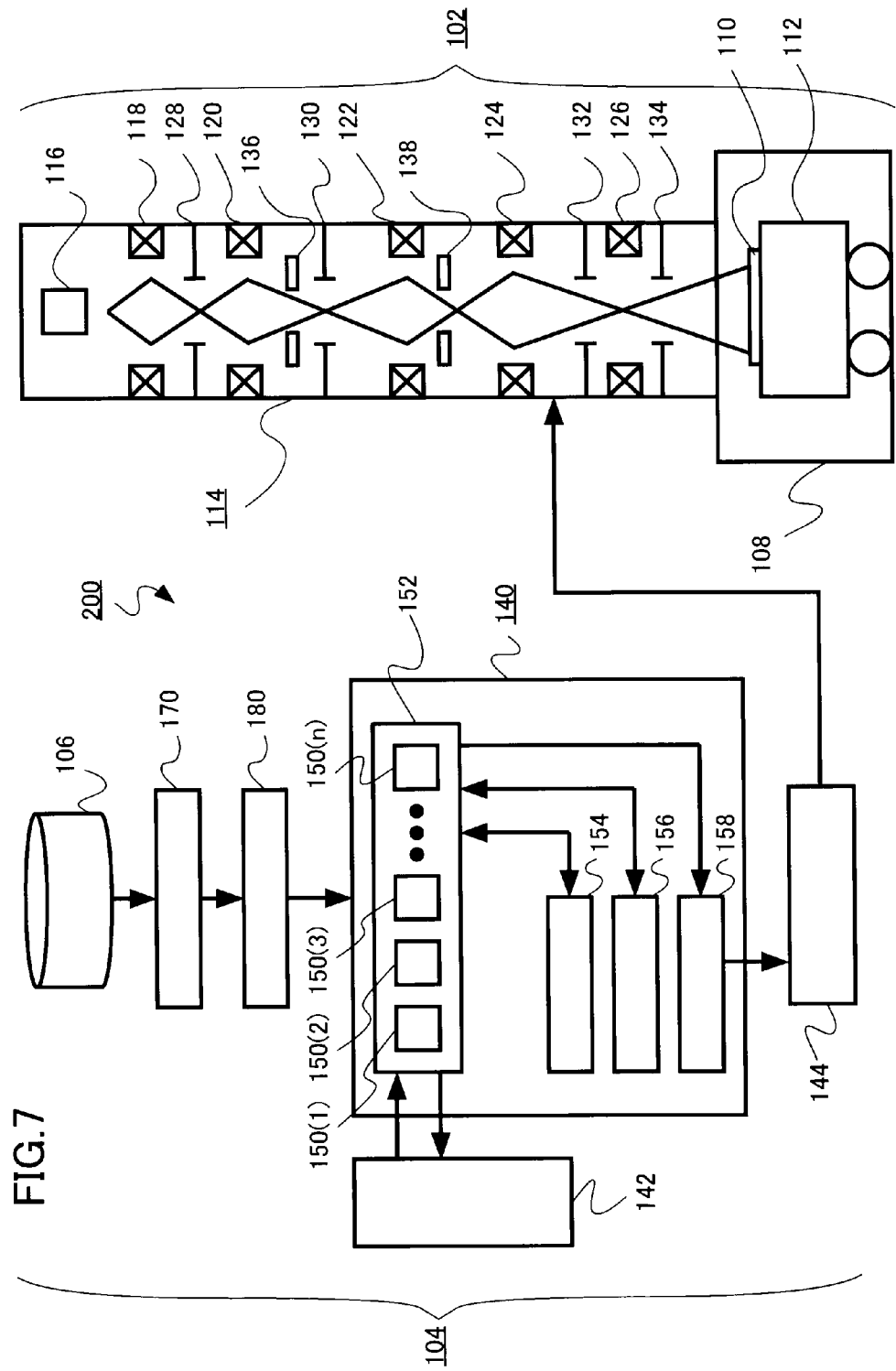
FIG. 7 is a schematic configuration diagram of an electron beam writing apparatus according to Embodiment 2.

FIG. 7 is a schematic configuration diagram of an electron beam writing apparatus according to the embodiment. The electron beam writing apparatus 200 is the same as the electron beam writing apparatus 100 according to Embodiment 1, excepting that the apparatus 200 includes predicting unit 170 in the control unit 104.

The predicting unit 170 has a function to predict a shot density (density of the shot pattern) when the plurality of figure patterns in the layout data are converted to shot patterns of shot units used when a charged particle beam is shot onto the target object. The predicting unit divides the chip region into a plurality of predict regions, for example, and predicts a shot density of each of the predict regions.

The dividing unit 180 has a function to divide the chip region into a plurality of process regions based on the predicted shot density.

Figure 8:
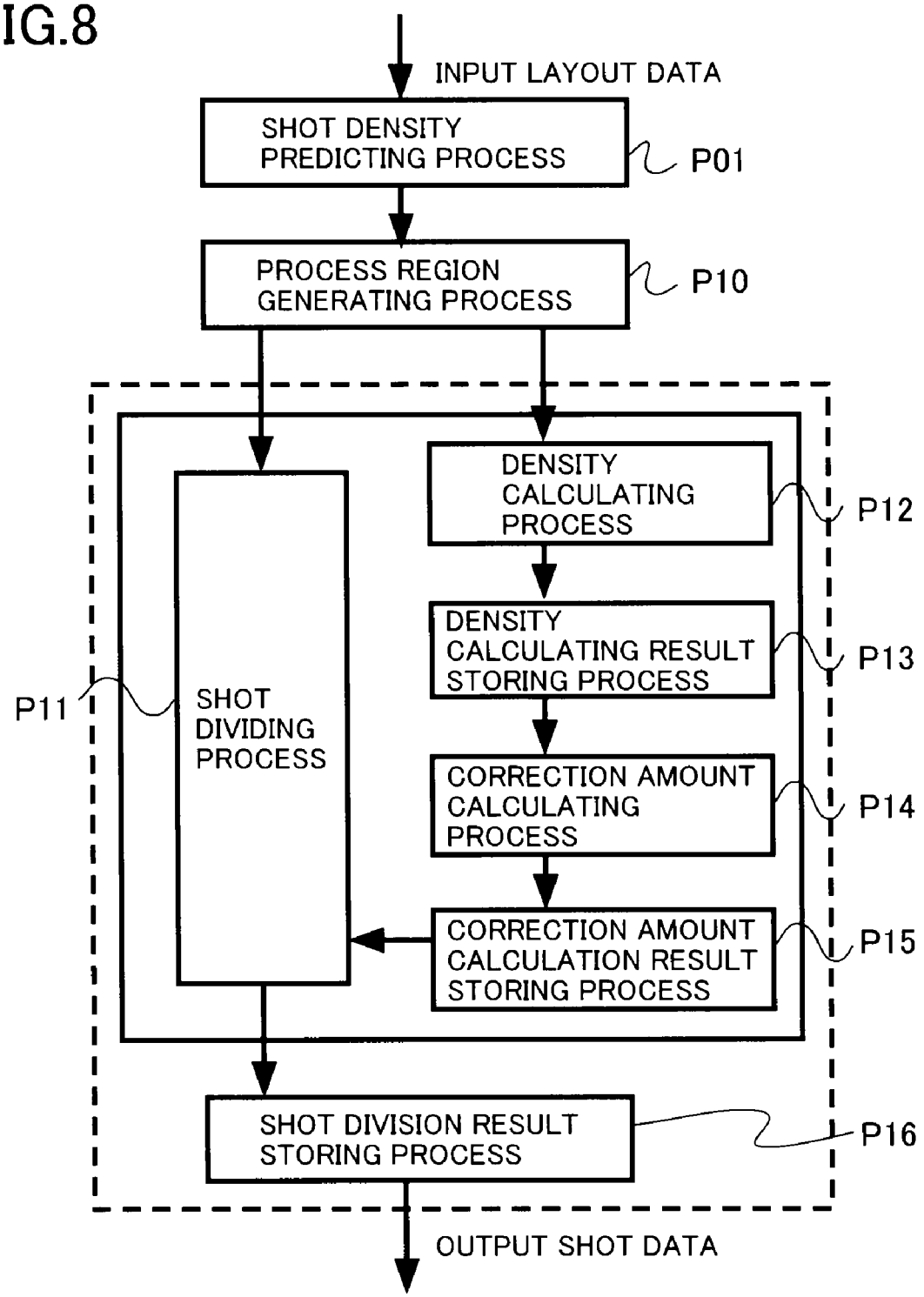
FIG. 8 is an explanatory diagram of a processing performed by a control unit of the electron beam writing apparatus according to Embodiment 2.
Figure 9A:
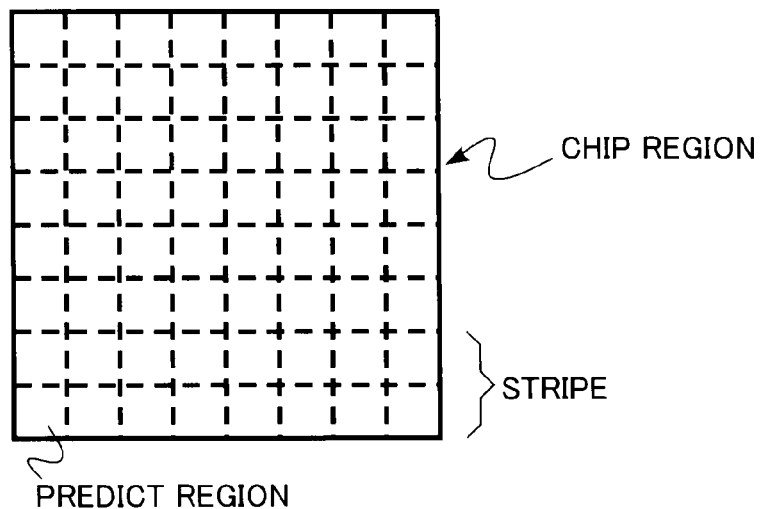
FIG. 9 is an explanatory diagram of dividing data according to Embodiment 2.
Figure 9B:
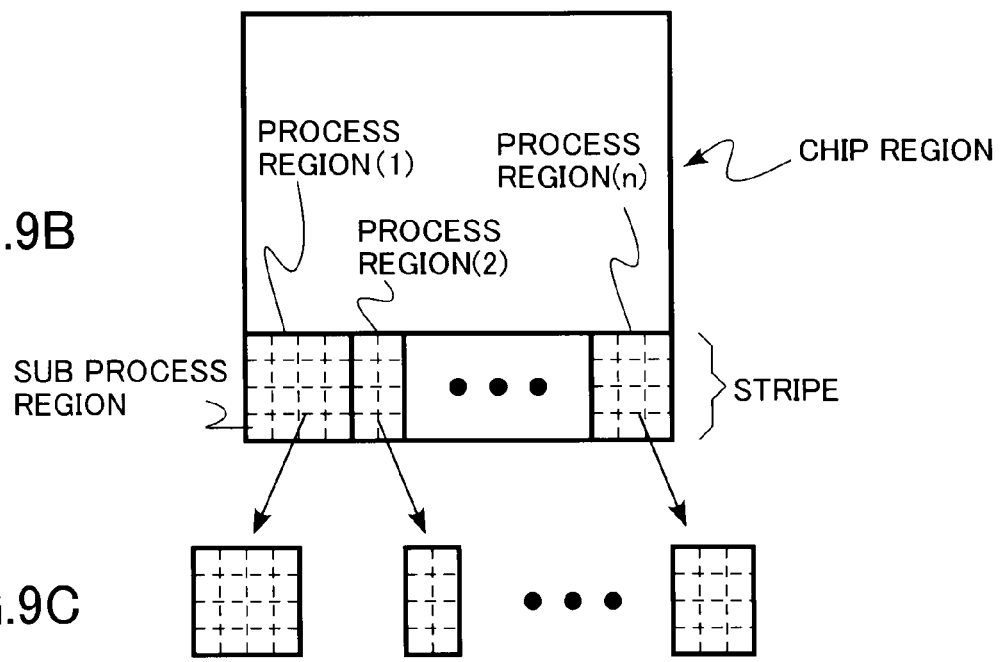
Figure 9C:
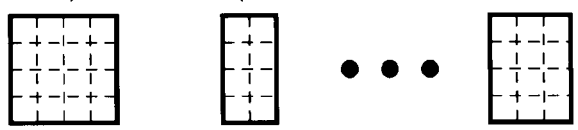

Next, a writing method using the electron beam writing apparatus 200, particularly, data processing by the writing unit 104 is explained referring to FIGS. 7 to 9. FIG. 8 is an explanatory diagram of processing process performed by a control unit of the electron beam writing apparatus according to Embodiment 2. FIG. 9 is an explanatory diagram of dividing data according to Embodiment 2.

The control unit 104 generates shot data for the writing process performed by the writing unit 102 from the layout data similarly to Embodiment 1.

Layout data defining a plurality of figure patterns in a chip region is input to the data storage unit 106 and the layout data is stored.

The dividing unit 180 divides the chip region in the layout data supplied from the data storage unit 106 into a plurality of process regions. Before the process, the predicting unit 170 predicts the shot density.

Then, the shot data generating unit 140 converts the pattern data of the plurality of figure patterns defined by the layout data so as to generate shot data for shooting an electron beam onto the target object.

FIG. 8 is an explanatory diagram of a processing performed by the predicting unit 170, the dividing unit 180 and the shot data generating unit 140. The processing process includes a shot density predicting process P01, the process region generating process P10, the shot dividing process P11, the density calculating process P12, the density calculation result storing process P13, the correction amount calculating process P14, the correction amount storing process P15, and the shot division result storing process P16.

In the shot density predicting process P01, a shot density when the plurality of figure patterns in the chip region of the layout data are converted to shot patterns of shot units used when a charged particle beam is shot onto the target object is predicted. For example, the chip region is divided into a plurality of predict regions of square shape so as to form a mesh shape as shown in FIG. 9A. Then, a shot density, which is a density of figure pattern as a unit upon shooting, of each of the predict regions is predicted. The shot density predicting process P01 is performed by the predicting unit 170 (FIG. 7).

At this time, predicting precision of the shot density can be increased by dividing into smaller predict regions, that is, by setting the mesh size smaller. Therefore, a failure due to existence of a process region having unexpectedly large amount of data may be avoided during later data processing of shot data generation. However, dividing into too small predict regions may increase processing load of the shot density predicting process P01 so as to decrease the data processing speed, and thus is not preferable.

In the process region generating process P10, the chip region is divided into a plurality of stripes as shown in FIG. 9B so that the layout data can be processed through parallel distributed processing in a later processing process. Further, each of the stripes is divided into a plurality of process regions (1) to (n), which are process units of parallel distributed processing. One process region is further divided into a plurality of sub process regions (sub fields). The process region generating process P10 is performed by the dividing unit 180.

The size of the process region is determined based on the shot density predicted by the shot density predicting process P01. The size of the process region is determined in such a manner that amount of data of the process region is not larger than the amount of data allowed by later processes in processing. Therefore, the size becomes large as shown by the process region (1) in a part where the shot density is low and the amount of data is small, whilst the size becomes small as shown by the process region (2) in a part where the shot density is high and the amount of data is large.

The processing in each of the shot dividing process P11, the density calculating process P12, the density calculation result storing process P13, the correction amount calculating process P14, the correction amount calculation result storing process P15, and the shot division result storing process P16 is the same as that in Embodiment 1.

In addition, the configuration and the function of the determining and instructing unit 142 is the same those in Embodiment 1.

As described above, the charged particle beam writing apparatus according to the embodiment includes the apparatus includes the predicting unit, and thus, can divide process regions to obtain process regions having a size of more appropriate amount of data. Therefore, more efficient data processing can be realized. Even when the dividing unit generates a process region having larger amount of data than expected due to low predicting precision of the predicting unit, for example, the process region is automatically divided during data processing. Therefore, a decrease in processing speed, unexpected stop of writing, and the like due to excess amount of data can be prevented. At this time, a data processing load can be reduced so as to improve data processing speed of the predicting unit, then improve data processing speed of whole of the apparatus by not requiring an excess predicting precision for the predicting unit.

In the embodiment, it is preferable that the predicting unit divides the chip region into a plurality of predict regions of square shape, predicts a shot density of each of the predict regions, and set the area of each of the predict regions smaller than each of the process regions. The reason is that if the area of each of the predict regions is larger than the area of each of the process regions, a large number of unnecessary process regions each having small amount of data are generated, which may decrease the data processing speed in later processes.

The components described as "XXX unit" and "XXX process" in the above description can be configured by a program executable on a computer. Alternatively, the components can be configured by a hardware or a combination of hardware and software. When the components are configured by a program, the program is stored in storage medium such as a magnetic disk device, a magnetic tape device, FD, CD, DVD, MO, or ROM.

In the above description, the embodiments are explained while referring to specific examples. However, the invention is not limited to the specific examples.

For example, the shot dividing process P11 is explained as an example in the embodiments, but the invention may be applied to other processes including the density calculating process P12, the correction amount calculating process P14, and the like.

For example, monitoring of amount of output data and determining by the determining and instructing unit 142 may be performed for each of the computing processors. Alternatively, the determining and instructing unit 142 may monitor a plurality of processes performed for the plurality of computing processor, and determine and instruct for one of the computing processors. Such a method is preferable when the plurality of computing processors shares one buffer memory and the capacity of the buffer memory limits the speed of data processing, for example.

In the above description, a mask is explained as an example of the substrate, but the invention can also be applied to the case where a semiconductor wafer is used as the substrate and a pattern is directly formed on the wafer by an electron beam.

The data storage unit 106, the predicting unit 170, the dividing unit 180, the shot data generating unit 140, and the determining and instructing unit 142 may be an apparatus of processing data for charged particle beam writing that is separated from the charged particle beam writing apparatus.

Although parts such as an apparatus configuration and control method which are not directly required for the explanation of the present invention are not described, a required apparatus configuration or a required control method can be arbitrarily selected and used. In addition, all charged particle beam writing apparatuses, charged particle beam writing methods, and apparatuses of processing data for charged particle beam writing having elements of the present invention and obtained by those skilled in the art through appropriate change of the design are included in the scope of the present invention.

What is claimed is:

1. A charged particle beam writing apparatus comprising:
    a data storage unit configured to store layout data defining a plurality of figure patterns in a chip region;
    a dividing unit configured to divide the chip region in the layout data into a plurality of process regions;
    a shot data generating unit configured to perform distributed processing on pattern data of the figure patterns in the process regions using a plurality of computing processors so as to convert the pattern data to shot data for shooting a charged particle beam onto a target object;
    a determining and instructing unit configured to compare an amount of output data from each of the computing processors with a predetermined threshold, and when the amount of the output data is larger than the threshold, instruct corresponding one of the computing processors to divide corresponding one of the process regions into smaller regions and continue the data processing; and
    a writing unit configured to write on the target object using the shot data.

2. The charged particle beam writing apparatus according to claim 1, further comprising a predicting unit configured to predict a shot density when the plurality of figure patterns are converted to shot patterns of shot units used when a charged particle beam is shot onto the target object, wherein the dividing unit is configured to divide the chip region into a plurality of process regions based on the predicted shot density.

3. The charged particle beam writing apparatus according to claim 2 wherein,
the predicting unit is configured to divide the chip region into a plurality of predict regions and predict a shot density of each of the predict regions, and
an area of each of the predict regions is set smaller than an area of each of the process regions.

4. The charged particle beam writing apparatus according to claim 1, wherein
each of the process regions is previously sub-divided into sub process regions of a certain size, and the determining and instructing unit instructs to continue the process by dividing the process region into units of the sub process region.

5. A charged particle beam writing method comprising:
storing layout data defining a plurality of figure patterns in a chip region;
dividing the chip region in the layout data into a plurality of process regions;
performing distributed processing on pattern data of the figure patterns in the process regions using a plurality of computing processors so as to convert the pattern data to shot data for shooting a charged particle beam onto a target object;
comparing an amount of output data from each of the computing processors with a predetermined threshold, and when the amount of the output data is larger than the threshold, instructing corresponding one of the computing processors to divide corresponding one of the process regions and continue the data processing; and
writing on the target object using the shot data.

6. The charged particle beam writing method according to claim 5 further comprising:
predicting a shot density when the plurality of figure patterns are converted to shot patterns of shot units used when a charged particle beam is shot onto the target object; and dividing the chip region in the layout data into a plurality of process regions based on the predicted shot density.

7. The charged particle beam writing method according to claim 6 further comprising: dividing the chip region into a plurality of predict regions and predicting a shot density of each of the predict regions; and
setting an area of each of the predict region smaller than an area of each of the process regions.

8. The charged particle beam writing method according to claim 5 further comprising:
previously sub-dividing each of the process regions into sub process regions of a certain size; and
instructing to continue the process by dividing the process region into units of the sub process region.

9. An apparatus of processing data for charged particle beam writing comprising:
a data storage unit configured to store layout data defining a plurality of figure patterns in a chip region;
a dividing unit configured to divide the chip region in the layout data into a plurality of process regions;
a shot data generating unit configured to perform distributed processing on pattern data of the figure patterns in the process regions using a plurality of computing processors so as to convert the pattern data to shot data for shooting a charged particle beam onto a target object; and
a determining and instructing unit configured to compare an amount of output data from each of the computing processors with a predetermined threshold, and when the amount of the output data is larger than the threshold, instruct corresponding one of the computing processors to divide corresponding one of the process regions and continue the data processing.

10. The apparatus of processing data for charged particle beam writing according to claim 9, further comprising a predicting unit configured to predict a shot density when the plurality of figure patterns are converted to shot patterns of shot units used when a charged particle beam is shot onto the target object, wherein
the dividing unit is configured to divide the chip region into a plurality of process regions based on the predicted shot density.

11. The apparatus of processing data for charged particle beam writing according to claim 10, wherein
the predicting unit is configured to divide the chip region into a plurality of predict regions and predict a shot density of each of the predict regions, and
an area of each of the predict regions is set smaller than an area of each of the process regions.

12. The apparatus of processing data for charged particle beam writing according to claim 9, wherein
each of the process regions is previously sub-divided into sub process regions of a certain size, and the determining and instructing unit instructs to continue the process by dividing the process region into units of the sub process region.

* * * * *